US006110542A

United States Patent [19]
Miyanaga et al.

[11] Patent Number: 6,110,542
[45] Date of Patent: *Aug. 29, 2000

[54] METHOD FOR FORMING A FILM

[75] Inventors: Akiharu Miyanaga; Tohru Inoue, both of Kanagawa; Shunpei Yamazaki, Tokyo, all of Japan

[73] Assignee: Semiconductor Energy Laboratory Co., Ltd., Kanagawa-ken, Japan

[ * ] Notice: This patent is subject to a terminal disclaimer.

[21] Appl. No.: 09/262,853

[22] Filed: Mar. 5, 1999

Related U.S. Application Data

[62] Division of application No. 08/740,140, Oct. 22, 1996, which is a division of application No. 08/463,058, Jun. 5, 1995, Pat. No. 5,626,922, which is a division of application No. 08/426,483, Apr. 20, 1995, abandoned, which is a continuation of application No. 08/120,222, Sep. 14, 1993, abandoned, which is a continuation of application No. 07/763,595, Sep. 23, 1991, abandoned.

[30] Foreign Application Priority Data

Sep. 25, 1990 [JP] Japan ..................... 2-254520
Sep. 25, 1990 [JP] Japan ..................... 2-254521
Sep. 25, 1990 [JP] Japan ..................... 2-254522

[51] Int. Cl.[7] .................... H05H 1/24; H05H 1/02
[52] U.S. Cl. ............... 427/577; 427/249.7; 427/571; 427/572; 427/575; 427/902; 427/904; 427/576; 427/578; 427/122; 427/249.8
[58] Field of Search ................ 427/577, 249.7, 427/249.8, 571, 575, 122, 572, 902, 904, 576, 578

[56] References Cited

U.S. PATENT DOCUMENTS

| | | | |
|---|---|---|---|
| 3,661,637 | 5/1972 | Sirtl ........................... | 118/725 |
| 3,911,318 | 10/1975 | Spero ......................... | 315/39 |
| 4,047,496 | 9/1977 | Mc Neilly .................. | 118/725 |
| 4,183,780 | 1/1980 | McKenna et al. ........... | 156/345 X |
| 4,238,708 | 12/1980 | Kaneda ...................... | 315/289 |
| 4,349,582 | 9/1982 | Beerwald et al. ........... | 427/575 |
| 4,401,054 | 8/1983 | Matsuo et al. .............. | 427/571 |
| 4,438,368 | 3/1984 | Abe ............................ | 118/723 |

(List continued on next page.)

FOREIGN PATENT DOCUMENTS

| | | | |
|---|---|---|---|
| 0046945 | 3/1982 | European Pat. Off. . | |
| 59-63732 | 4/1984 | Japan ........................ | 423/446 |
| 60-103098 | 6/1985 | Japan ........................ | 423/446 |
| 60-234403 | 11/1985 | Japan . | |
| 61-36200 | 2/1986 | Japan . | |
| 61-158898 | 6/1986 | Japan . | |
| 61-150219 | 7/1986 | Japan ........................ | 156/345 |
| 62-96397 | 5/1987 | Japan ........................ | 423/446 |
| 62-123096 | 6/1987 | Japan . | |
| 63-225528 | 9/1988 | Japan . | |
| 1-59729 | 3/1989 | Japan . | |
| 1-73776 | 3/1989 | Japan . | |
| 1-214122 | 8/1989 | Japan . | |
| 2-102197 | 4/1990 | Japan . | |
| 2 105 729 | 3/1983 | United Kingdom . | |

OTHER PUBLICATIONS

Hiroshi Kawarada et al., "Large Area Chemical Vapour Deposition of Diamond Particles and Films Using Magneto–Microwave Plasma", Japanese Journal of Applied Physics, vol. 26, No. 6, Jun., 1987, pp. L1032–L1034.

McGraw–Hill Encyclopedia of Science and Technology, vol. 6, pp. 387–388, ©1960, New York.

*Primary Examiner*—Roy V. King
*Attorney, Agent, or Firm*—Eric J. Robinson; Nixon Peabody LLP

[57] ABSTRACT

A method for forming a film by a plasma CVD process in which a high density plasma is generated in the presence of a magnetic field is described, characterized by that the electric power for generating the plasma has a pulsed waveform. The electric power typically is supplied by microwave, and the pulsed wave may be a complex wave having a two-step peak, or may be a complex wave obtained by complexing a pulsed wave with a stationary continuous wave of an electromagnetic wave having the same or different wavelength as that of the pulsed wave. The process enables deposition of a uniform film having an excellent adhesion to the substrate, at a reduced power consumption.

88 Claims, 5 Drawing Sheets

U.S. PATENT DOCUMENTS

| | | | |
|---|---|---|---|
| 4,481,229 | 11/1984 | Suzuki | 427/47 |
| 4,503,807 | 3/1985 | Nakayama | 118/725 |
| 4,513,684 | 4/1985 | Nath et al. | 427/572 |
| 4,532,199 | 7/1985 | Ueno | 427/571 |
| 4,559,100 | 12/1985 | Ninomiya | 156/643 |
| 4,563,240 | 1/1986 | Shibata | 156/643 |
| 4,569,738 | 2/1986 | Kieser et al. | 427/523 X |
| 4,636,401 | 1/1987 | Yamazaki et al. | 118/719 |
| 4,640,224 | 2/1987 | Bunch | 118/723 |
| 4,657,776 | 4/1987 | Dietrich et al. | 427/576 |
| 4,663,183 | 5/1987 | Ovshinsky et al. | 427/39 |
| 4,684,535 | 8/1987 | Heinecke et al. | 427/491 |
| 4,727,293 | 2/1988 | Asmussen et al. | 315/111.41 |
| 4,764,394 | 8/1988 | Conrad | 427/525 |
| 4,776,918 | 10/1988 | Otsubo | 156/345 |
| 4,816,113 | 3/1989 | Yamazaki | 118/50.1 X |
| 4,824,690 | 4/1989 | Heinecke et al. | 427/577 |
| 4,869,923 | 9/1989 | Yamazaki | 427/571 |
| 4,876,983 | 10/1989 | Fukuda et al. . | |
| 4,891,118 | 1/1990 | Ooiwa et al. | 204/192.32 |
| 4,910,041 | 3/1990 | Yanagihara et al. | 427/571 |
| 4,910,043 | 3/1990 | Freeman et al. | 427/572 |
| 4,933,300 | 6/1990 | Koinuma et al. | 437/110 |
| 4,935,303 | 6/1990 | Ikoma et al. | 428/408 |
| 4,935,661 | 6/1990 | Heinecke et al. | 315/111.21 X |
| 4,973,494 | 11/1990 | Yamazaki . | |
| 5,015,493 | 5/1991 | Gruen | 204/298.05 X |
| 5,015,494 | 5/1991 | Yamazaki et al. | 427/571 |
| 5,039,548 | 8/1991 | Hirose et al. | 427/571 |
| 5,085,750 | 2/1992 | Soraoka et al. | 156/345 |
| 5,093,151 | 3/1992 | Van Den Gerg et al. | 427/569 |
| 5,126,163 | 6/1992 | Chan | 427/531 |
| 5,138,520 | 8/1992 | McMillan et al. | 427/565 |
| 5,160,397 | 11/1992 | Doki et al. | 156/345 |
| 5,162,296 | 11/1992 | Yamazaki | 427/576 |
| 5,182,132 | 1/1993 | Murai et al. | 427/577 |
| 5,230,931 | 7/1993 | Yamazaki et al. | 427/569 |
| 5,231,057 | 7/1993 | Doki et al. | 427/571 |
| 5,252,178 | 10/1993 | Moslehi | 156/643 |
| 5,266,363 | 11/1993 | Yamazaki . | |
| 5,289,010 | 2/1994 | Shohet | 250/492.21 |
| 5,296,272 | 3/1994 | Matossian et al. | 427/523 |
| 5,330,800 | 7/1994 | Schumacher et al. | 427/566 |
| 5,354,381 | 10/1994 | Sheng | 118/723 E |
| 5,427,827 | 6/1995 | Shing et al. | 427/577 |
| 5,626,922 | 5/1997 | Miyanaga et al. . | |

(A)

(B)

TIME →

METHOD FOR FORMING A FILM

This application is a Divisional application of Ser. No. 08/740,140, filed Oct. 22, 1996; which itself is a Divisional of Ser. No. 08/463,058, filed Jun. 5, 1995, now U.S. Pat. No. 5,626,922; which is a divisional of Ser. No. 08/426,483, filed Apr. 20, 1995 (now abandoned); which is a Continuation of Ser. No. 08/120,222, filed Sep. 14, 1993 (now abandoned); which is a Continuation of Ser. No. 07/763,595, filed Sep. 23, 1991 (now abandoned).

BACKGROUND OF THE INVENTION

1. Field of the Invention

The present invention relates to a method for forming a film.

2. Description of the Prior Art

Films have been heretofore deposited by various processes such as CVD (chemical vapor deposition), sputtering, MBE (molecular beam epitaxy), and the like. In plasma enhanced CVD (referred to simply hereinafter as plasma CVD), the use of high frequency excitation, microwave excitation, hybrid resonance and the like has been developed. Particularly in the plasma CVD process which utilizes a resonance with a magnetic field (referred to as "plasma CVD in magnetic field", hereinafter), the development thereof has actively taken place and, because of its high film deposition efficiency which results from the use of a high density plasma, its diversification in application has been expected. In the practical film deposition in the presence of a magnetic field, however, a difficulty has been encountered to deposit uniform films on an irregular surface without being influenced by such surface irregularity. This difficulty has hindered practical progress of the microwave CVD in magnetic field in the industries. The fact that a plasma CVD in magnetic field consumes an enormous amount of energy at its operation also is a bar to its gaining popularity in the industrial field. A diamond-like carbon (DLC) film can be uniformly deposited on a substrate as large as 10 cm or more in diameter by the use of microwave plasma CVD in magnetic field. In the deposition of such DLC films by this process, the diamond nuclei formed in the vapor phase are trapped on the substrate upon their contact with the substrate. Thus, the DLC film grows spread in a tapered form from each nucleus, and results in a film having poor adhesion with the substrate. Furthermore, since the diamond crystals grow in a tapered form from a diamond nucleus center trapped on the substrate, a compression stress accumulates around the grain boundaries within the DLC film. The poor adhesion of the film with the substrate and the compression stress within the film have constituted a hindrance to the practical use of DLC films.

SUMMARY OF THE INVENTION

An object of the present invention is to provide a process of depositing uniform films.

Another object of the present invention is to provide a process of depositing films with small power consumption.

Still another object of the present invention is to provide a process of depositing films which have excellent adhesion with substrates.

The foregoing objects and other objects have been achieved by depositing films by a plasma CVD process which takes advantage of the interaction between a magnetic field and an electric field, e.g. a high frequency electric field, induced by supplying an electric energy intermittently, or of that between a magnetic field and an electric field, e.g. a high frequency electric field, induced by supplying thereto an electric energy intermittently and a stationary electromagnetic energy continuously which are superposed upon each other. The magnetic field may be generated by supplying an electric energy intermittently. Alternatively, the magnetic field may be obtained by supplying either a DC current or a pulsed current to a Helmholtz coil. Furthermore, rise and decay of the pulsed current for generating the magnetic field intermittently and those of the electric power for generating the electric field intermittently may be synchronized with each other. In a typical embodiment, a microwave electric energy is supplied to generate the high frequency electric field.

In FIGS. 3(A), 3(B), and 3(C) are given examples of time versus power (effective value of power). FIG. 3(A) shows a shape having two different peak values. Such a power is particularly effective in increasing production of substances over a certain threshold value while suppressing the production of substances having an energy of production lower than the threshold value. FIG. 3(B) shows time versus power (effective value of power) of a wave obtained by superposing a high frequency electric wave supplied intermittently upon a low power electromagnetic stationary wave supplied continuously, wherein the initial waves have the same frequency. FIG. 3(C) also shows time versus power (effective value of power) of a wave obtained by superposing a high frequency electric wave supplied intermittently upon a low power electromagnetic stationary wave supplied continuously, however, the frequency of the initial waves are differed. The plasma CVD of the present invention is referred also to as a pulsed plasma CVD hereinafter since the power has a pulse shape as shown in FIGS. 3(A) to 3(C). The use of waves obtained by the superposition enables rapid deposition of the films, and is useful when a stable plasma cannot be obtained only by an intermittently supplied wave due to the structural allowance of the apparatus or to the conditions restricting the film deposition process. Thus, from the characteristic of a pulsed plasma CVD which enables a uniform formation of nuclei for film growth on the surface of substrates, the process enables deposition of a highly homogeneous film on an article having an irregular surface on one hand; on the other hand, from the fact that a high electric power can be concentrated at a pulse peak as compared with a stationary continuous power, the film deposition can be carried out at an increased efficiency.

To obtain a film of uniform thickness extended over a large area on a substrate, the film deposition is conducted in an apparatus the inner pressure of which is elevated to a range of from 0.03 to 30 Torr, preferably, from 0.3 to 3 Torr, using a high density plasma taking advantage of hybridized resonance. Since the pressure is maintained high, the mean free path of the reactive gas is shortened to a range of from 0.05 mm to several millimeters, particularly to 1 mm or less. This facilitates dispersion of the reactive gas to various directions, which is advantageous for depositing films on the sides of the articles having irregular surfaces. Thus, the rate of film growth is accelerated.

The article to be coated with a film is placed either in a hybridized resonance environment or in an activated environment remote from the hybridized resonance environment, to thereby coat the surface thereof with the reaction product. To achieve efficient coating, the article is located in the region at which a maximum electric field intensity of the microwave power can be obtained, or in the vicinity thereof. Furthermore, to generate and maintain a high density plasma at a pressure as high as in the range of from 0.03 to 30 Torr, an ECR (electron cyclotron resonance) should be generated in a columnar space under a low vacuum of $1 \times 10^{-4}$ to $1 \times 10^{-5}$ Torr and a gas, a liquid, or a solid is then introduced into the columnar space to produce a plasma, which is then maintained under a high pressure in the range of from 0.03 to 30 Torr, preferably from 0.3 to 30 Torr, so as to obtain a space having a highly concentrated product gas, said concentration per volume being about $10^2$ to $10^4$ times as large as the gas concentration normally used in a conventional ECR CVD process. By thus realizing the particular environment, the film deposition of a material which undergoes decomposition or reaction only at such a high pressure becomes possible. The particular films which can be obtained include carbon films, diamond films, i-carbon (carbon films containing diamonds or microcrystal grains), DLC (diamond-like carbon films), and insulating ceramics, and metallic films, in particular films of metal having high melting point.

In summary, the process according to the present invention utilizes plasma grow discharge and comprises a known microwave plasma CVD process to which a magnetic field is added to utilize the interaction of the magnetic field with the high frequency (micro wave) electric field. However, the ECR conditions are omitted from the process. The process according to the present invention conducts the film deposition in a hybridized resonance space using a high density plasma having a high energy, under a high pressure in the range of from 0.03 to 30 Torr. In the process according to the present invention, the plasma excitation is carried out with a pulsed wave or a combination of a pulsed wave and a stationary continuous wave, as set forth above, under a high energy state in the hybridized resonance space to thereby generate active species at an increased amount and also to effect homogeneous nuclei formation on the surface of the substrate. This enables the formation of a thin film material at an excellent reproducibility.

The power is supplied in pulses, as mentioned earlier, at an average power of from 1.5 to 30 KW with a peak pulse about three times the average power. The primary pulse should be supplied at a period of from 1 to 30 ms, preferably from 5 to 8 ms. Since the intensity of the magnetic field can be varied as desired, it is another characteristic of the process according to the present invention that the resonance condition can be set for not only the electrons but also for a specified ion.

In the deposition of a DLC film, for example, a pulsed wave having relationship between time and power (effective value of power) as shown in FIG. 4 can be applied. Preferably, the bonding within the DLC film is in $sp^3$ hybridization. The ratio of the dissociation energy for $sp^3$ hybridization to that for $sp^2$ hybridization is 6:5. In FIG. 4, it can be seen that the first peak 30 is 6/5 times as high as the second peak 31. In this case, the energy for the first peak 30 is preferably smaller than the dissociation energy of $sp^3$ hybridization but maintained higher than the dissociation energy of $sp^2$ hybridization, so as not to break the $sp^3$ hybridization bonding but to promote breakage of $sp^2$ hybridization bonding. More specifically, for example, the energy of the first peak is set in the range of from 5 to 50 KW, and that of the second peak is set in the range of from 4.1 to 46 KW. Furthermore, in a pulsed high frequency plasma CVD, the nucleus formation is activated while the growth of the formed nuclei is suppressed. Such a phenomena results in a uniform formation of crystal nuclei over the substrate, which is followed by a growth into a DLC film composed of columnar crystals, said crystals being substantially one-direction oriented toward the upper direction. Thus, a DLC film having a uniform crystal structure and dominant in $sp^3$ hybridization can be deposited at a high reproducibility, free from problems frequently encountered in conventional processes, such as the stress due to tapered film growth and the peeling off of the deposited film induced therefrom. The pulsed wave power may be acicular pulse power, as well as the powers shown in FIGS. 6(A) and 6(B).

In another embodiment according to the present invention, a light (such as an ultraviolet (UV) light) may be simultaneously irradiated to the activated species to maintain the activated state for a longer duration. That is, the process comprises irradiating a light (e.g., a UV light) simultaneously with the generation of a high density plasma by the interaction of the pulsed microwave and the magnetic field, so that atoms excited to a high energy state can survive even at locations 10 to 50 cm distant from the area at which the maximum electric field intensity of the microwave power is obtained, i.e., the area at which a high density plasma is generated, since the high energy state is sufficiently maintained even on the surface of the article. This process enables deposition of a thin film over a further larger area. In the embodiment according to the present invention, a cylindrical column was established in such a space, and the article on which the film is to be deposited was provided inside the column to effect film deposition.

The generation of the microwave (at an average power in the range of from 1.5 to 30 KW) may be synchronized with the generation of the magnetic field using an electric power the pulse form of which is shown in FIG. 6(A). Alternatively, a multistep rectangular pulsed electric power as shown in FIG. 6(B) or that as shown in FIG.6(C) may be used in place of the pulsed electric power illustrated in FIG. 6(A). A multistep rectangular pulsed wave may be applied, for example, in the deposition of a DLC film. Since the microwave and the magnetic field in this instance can be supplied with a peak power of about 5.0 to 50 KW if such a pulsed wave is used, the result is about 30 to 40% increased efficiency as compared with the case a plasma CVD apparatus is operated in a magnetic field with an input of an ordinary continuous wave at a power of from 1.5 to 30 KW. This enables reduction of power consumption of the plasma CVD apparatus operated in the presence of a magnetic field. The pulse duration of the pulsed wave should be in the range of from 1 to 10 ms, more preferably, from 3 to 6 ms.

It is also clarified that a film composed of more densified crystal grains can be uniformly deposited on the article irrespective of the surface irregularities of the article by applying a pulsed wave to a plasma CVD process in a magnetic field. This is also an advantage of the process according to the present invention.

DETAILED DESCRIPTION OF THE PREFERRED EMBODIMENTS

EXAMPLE 1

Figure 1:
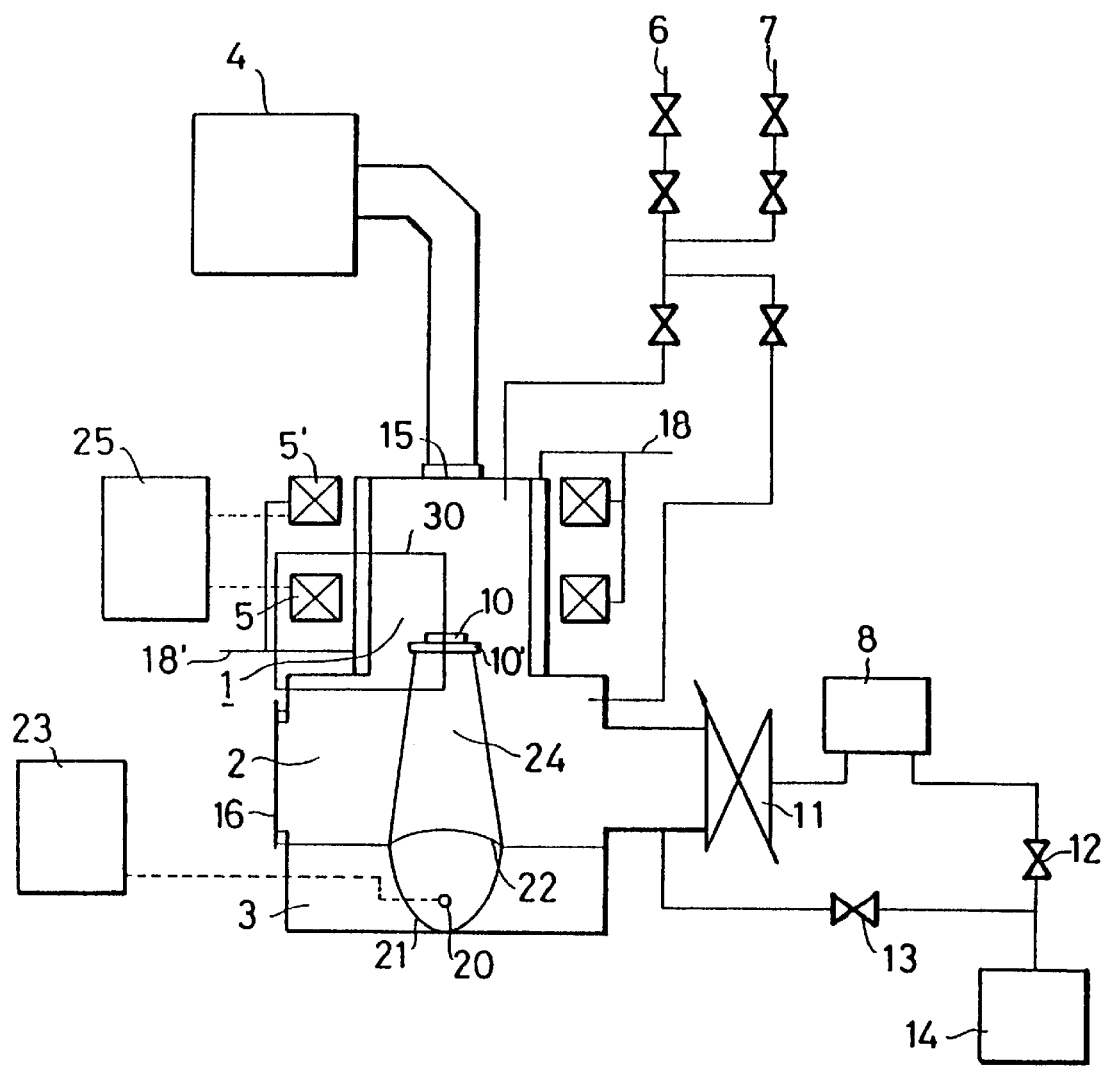
FIG. 1 is a schematic of an apparatus for microwave CVD in magnetic field according to the present invention.

Referring first to FIG. 1, a microwave plasma CVD apparatus according to the present invention, to which a magnetic field is applicable is shown. The apparatus comprises a plasma generating space 1, a supplementary space 2, Helmholtz coils 5 and 5' for generating the magnetic field, a power source 25 to supply energy to the Helmholtz coils, a generator 4 for generating pulsed microwaves (also for generating waves obtained by superposing a pulsed wave upon a stationary continuous wave), a turbo molecular pump 8 which constitutes an evacuation system, a rotary pump 14, a pressure control valve 11, a substrate holder 10', an article 10 on which a film is deposited, a microwave entrance window 15, a gas system 6 and 7, a water cooling system 18 and 18', a halogen lamp 20, a reflector 21, and a heating space 3.

The article 10 to which a film is deposited is first set on the substrate holder 10', and provided in a plasma generating space 1 through the gate valve 16. The substrate holder 10' is made of quartz lest it should disturb the microwave and the magnetic field. The whole apparatus is evacuated to a vacuum of $1 \times 10^{-6}$ Torr or higher using the turbo molecular pump 8 and a rotary pump 14. A gas which does not participate in the reaction (i.e., a gas which does not produce a solid upon decomposition reaction) such as hydrogen is introduced into the plasma generating space 1 through the gas system 6 at a flow rate of 30 SCCM to adjust the pressure thereof to $1 \times 10^{-4}$ Torr. Then, microwave of 2.45 GHz is applied externally at a pulse period of 8 ms. The magnetic field is applied at about 2 KGauss using the Helmholtz coils 5 and 5' to thereby generate a high density plasma in the plasma generating space 1. The gas is flown downward from the upper side of FIG. 1, however, it may be flown upward from the lower portion of FIG. 1, or may be flown from the right to the left, or vice versa.

The gas which does not participate in the reaction or electrons having a high energy discharged from the high density plasma reach and clean the surface of the article 10 on the substrate holder 10'. Then, while continuously introducing the gas which does not participate in the reaction, a reacting material (which forms a solid upon decomposition and reaction) in the form of a gas, liquid, or solid, such as a hydrocarbon gas [e.g., acetylene ($C_2H_2$), ethylene ($C_2H_4$), and methane ($CH_4$)], a liquid carbon compound [e.g., ethanol ($C_2H_5OH$) and methanol ($CH_3OH$)], and a solid hydrocarbon [e.g., adamantane ($C_{10}H_{16}$) and naphthalene ($C_{10}H_8$)] is introduced at a flow rate of 20 SCCM. The reacting material is converted into a plasma by virtue of the energies supplied thereto. The pressure inside the vessel is adjusted to the range of from 0.03 to 30 Torr, preferably in the range of from 0.1 to 3 Torr, specifically 0.5 Torr, for example, while maintaining the plasma already generated inside the vessel. The product gas can be concentrated per unit volume by thus elevating the pressure of the vessel, and it results in increasing the rate of film growth. A gas can reach anywhere on an irregular surface of an article by elevation of the pressure inside the vessel.

Thus, the thin film material is deposited in a process which comprises once generating a plasma under a low pressure, increasing the concentration of the active species of the reacting gas while maintaining the plasma state, forming active species excited to a high energy state, and depositing the active species on the article 10 provided on the substrate holder 10'.

Figure 2A:
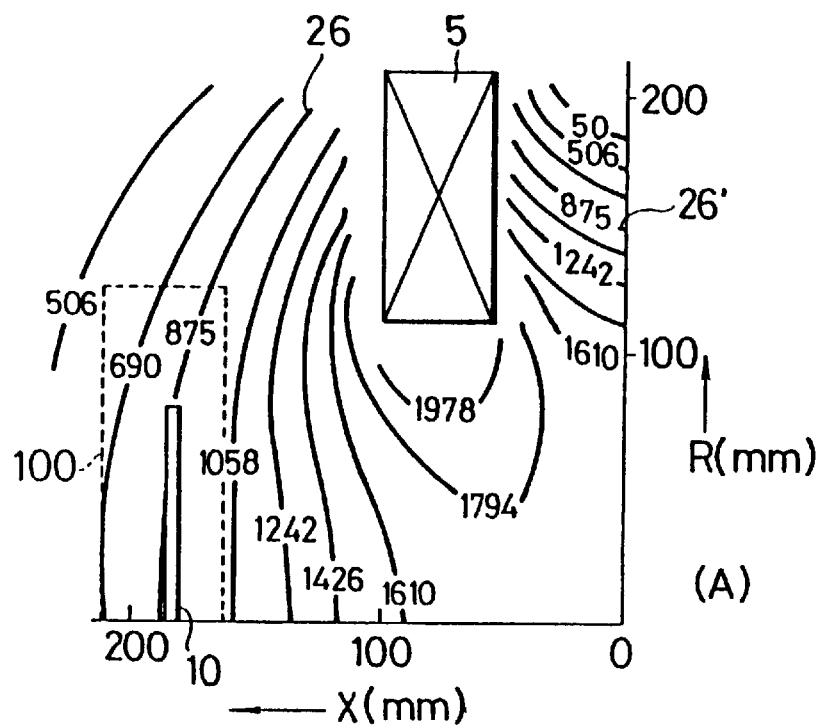
FIG. 2(A) shows a magnetic field obtained as a result of a computer simulation.
Figure 2B:
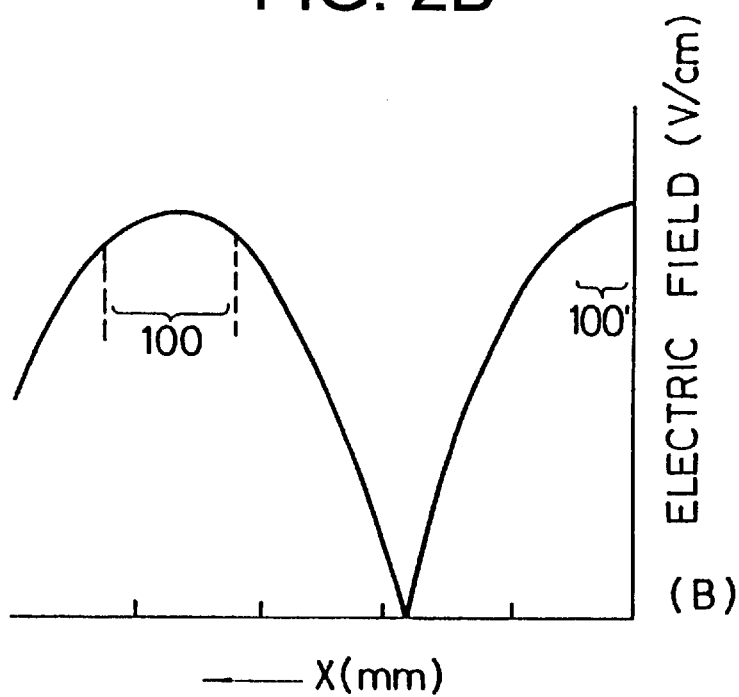
FIG. 2(B) shows an electric field obtained as a result of a computer simulation.

The magnetic field as shown in FIG. 1 is generated by a Helmholtz coil system using two ring-shaped coils 5 and 5'. A quarter of the electric field and that of the magnetic field are shown in FIGS. 2(A) and 2(B). Referring to FIG. 2(A), the abscissa (X-axis) represents the horizontal direction (the direction in which the reactive gas is discharged) of the space 30, and the ordinate (R-axis) represents the direction along the diameter of the Helmholtz coil. The curves drawn in FIG. 2(A) represent the equipotential plane of the magnetic field. The numerals placed on the curves indicate the intensity of the magnetic field obtained when the magnetic intensity of the Helmholtz coil 5 is about 2000 Gauss. The magnetic field intensity over a large film-deposition area of the substrate in a region 100 in which the interaction between the electric field and the magnetic field occurs can be controlled to a nearly constant value (875 Gauss≠185 Gauss) by adjusting the strength of the magnet 5, that is by adjusting current flowing the Helmholtz coil 5. FIG. 2(A) shows the equipotential planes in a magnetic field; in particular, curve 26 is the equipotential plane in the magnetic field for 875 Gauss, which corresponds to the ECR condition.

The region 100 in which the resonance condition is satisfied corresponds to the area having a maximum electric field intensity, as shown in FIG. 2(B). In FIG. 2(B), the abscissa corresponds to the flow direction of the reactive gas as in FIG. 2(A), and the ordinate represents the intensity of the electric field (electric field strength).

It can be seen that the electric field region 100' also yields a maximum intensity as well as the region 100. However, with reference to the magnetic field (FIG. 2(A)), it can be seen that equipotential planes in the magnetic field are densely distributed in this region 100'. It can be understood therefrom that a film deposited on the substrate in this region 100' may have great variation in thickness along the diameter direction (the direction along the ordinate in FIG. 2(A)), and that a favorable film is only obtainable in the region satisfying the ECR condition, i.e., along 26'. In conclusion, no uniform and homogeneous film can be expected in the region 100'. Film formation on an article may be carried out in the region 100' in the case where a film having a doughnut shape is formed.

A region in which the magnetic field maintains a constant value over a large area and in which the electric field strength attains a maximum also exists at a symmetrical position of the region 100 with respect to the origin. It is certainly effective to carry out film deposition at such a region so long as there is no necessity of heating the substrate. It is difficult to obtain, however, a means to heat the substrate without disturbance of the electric field generated by the microwave.

Upon considering the ease of mounting and demounting of the substrate as well as the heating thereof, and the achievement of a uniform and homogeneous film in view of the applicability of the process to the industrial mass production, the region 100 as shown in FIG. 2(A) outstands as a position superior to other two regions.

As a consequence of the considerations set forth above, it was made possible in this embodiment of the present invention to form a uniform and homogeneous film up to a 100-mm radius, more favorably, up to a 50-mm radius if a circular substrate 10 is placed in the region 100. To obtain a film having the same uniform thickness as that of the film mentioned above but with a further larger area, e.g., a film having an area 4 times as large as the film above, the frequency may be reduced to 1.225 GHz from the present 2.45 GHz to thereby double the diameter (the direction along the R axis of FIG. 2(A)) of the deposition space.

Figure 3A:
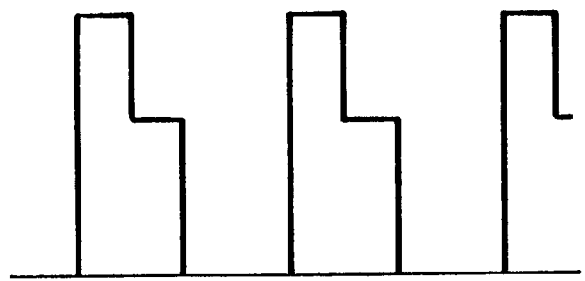
FIGS. 3(A), 3(B), and 3(C) each show a pulsed waveform according to the present invention.

A specific embodiment of a process using the complex pulse as shown in FIG. 3(A) can be exemplified by the deposition of a DLC film. It is known that the favorable bonding in a DLC film is in the form of $sp^3$ hybridization, and the point persists on how to reduce the $sp^2$ hybridization which is formed simultaneously with the $sp^3$ hybridization during the film deposition process. Since the ratio of the dissociation energy for $sp^3$ hybridization to that for $sp^2$ hybridization is approximately 6:5, the number of $sp^3$ hybridization can be certainly increased by setting the energy of the first peak in the range of from 5 to 50 KW, and that of the second peak to about ⅚ of the first peak, i.e., in the range of from 4.1 to 46 KW. The cross section of the thin film was examined with a scanning electron microscope to observe diamond crystals. As a result, it was confirmed that diamond crystals grew into granules. Particularly, the size of the diamond crystals was from 5 to 10 times as large as that of the diamond crystals deposited by applying a conventional stationary (continuous) microwave. Furthermore, it was customary in the conventional diamond films that they deposit initially as crystals of small diameter and gradually grow into crystals of larger diameter, and that they thereby suffer poor adhesion with the substrates. In the diamond crystals deposited by the pulsed wave process according to the present invention, however, the diamond crystals were large even at the interface with the depositing surface. Thus, a film can be formed on the substrate with the superior adhesion therebetween by the process according to the present invention. The electron beam diffraction image of the film revealed spots ascribed to single crystal diamonds, and it can be seen therefrom that a diamond structure clearly develop in the film by applying a power at an average output of 1.5 KW or higher.

Figure 3B:
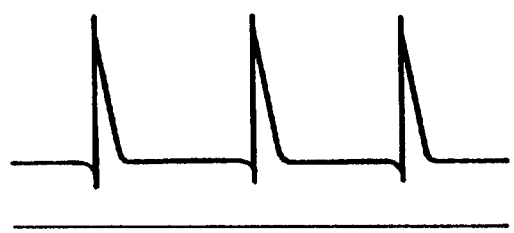
Figure 3C:
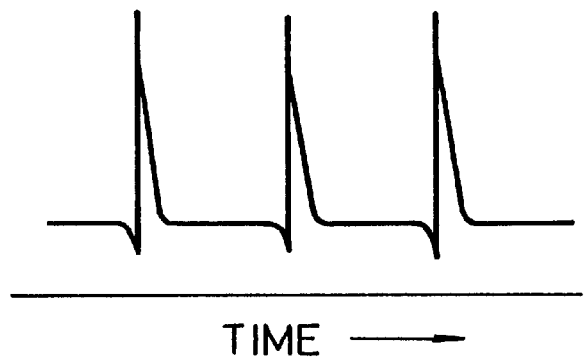

Processes which utilize the complex waves obtained from a pulsed wave and a stationary continuous wave as shown in FIGS. 3(B) and 3(C) can be applied widely. In the case where waves of the same wavelength are combined as is shown in FIG. 3(B), such as the combination of a microwave with another microwave or that of a high frequency wave and another high frequency wave, a uniform film can be deposited at a small energy consumption. If waves of differed wavelengths are combined as shown in FIG. 3(C), a film having excellent uniformity and adhesion can be obtained, as exemplified by the case in which a pulsed microwave was added to a stationary continuous high frequency wave. Various combinations of the waves, for example, a complex of a pulsed DC with a stationary continuous microwave, can be designed depending on the intended purpose. According to an embodiment according to the present invention, a polycrystalline film of silicon carbide can be deposited on the substrate by using a gas of carbosilicide (methylsilane). It is also possible to deposit a boron nitride film by the process according to the present invention, by simultaneously flowing a boride (e.g., diborane) and a nitride (e.g., nitrogen) to effect the reaction therebetween. Furthermore, the process may be utilized for depositing thin films of oxide superconductors such as Bi(bismuth)-based oxide superconductors, YBCO-type superconductors, Tl(thallium)-based oxide superconductors, and V(vanadium)-based (non-copper type) oxide superconductors. Similarly, thin films of aluminum nitride, aluminum oxide, zirconia, and boron phosphide can be deposited. Multilayered films thereof with diamond can be produced as well. It is also an embodiment of the present invention to deposit on an article, films of a metal having a high melting point, such as tungsten, titanium, and molybdenum or films of metal silicide such as tungsten silicide, titanium silicide, and molybdenum silicide; the metal film may be deposited by subjecting a halide or a hydride of the metal itself to a decomposition reaction on the article, and the metal silicide film may be deposited by reacting the halide or the hydride of the metal with silane.

EXAMPLE 2

Figure 4:
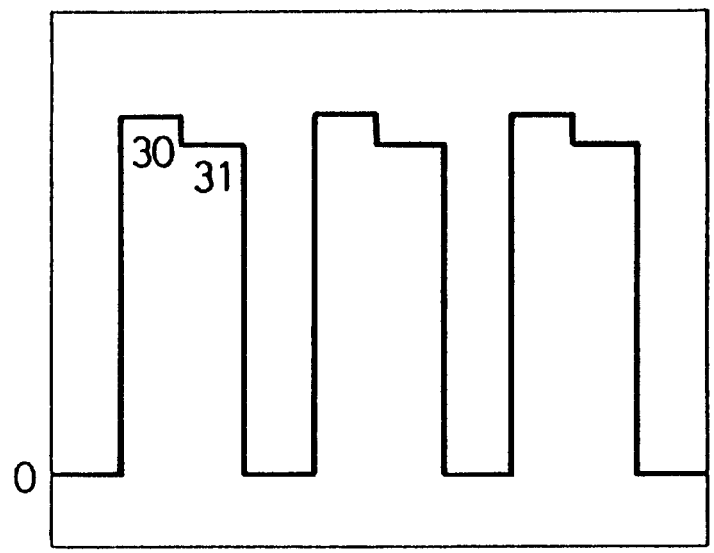
FIG. 4 shows a pulsed waveform according to the present invention.
Figure 5:
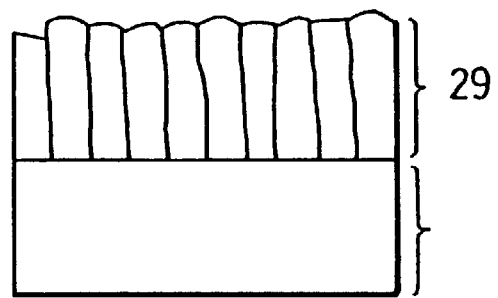
FIG. 5 is a schematically shown cross sectional view of a DLC film according to the present invention.

A DLC film was deposited in the same manner as in Example 1, except for using a microwave complex pulsed waveform power as shown in FIG. 4 in place of the complex pulsed waveform power shown in FIG. 3(A). A pulsed 2.45 GHz microwave power having a two-step peak composed of a first peak 30 of 50 KW and a second peak 31 of 46 KW, with a pulse period of 8 ms was externally applied.

The electron beam diffraction image of the film was completely free from halo patterns ascribed to amorphous substances, and it revealed the film to be composed of diamonds having high crystallinity. The cross section of the thin film was examined with a scanning electron microscope to observe diamond crystals. As a result, it was confirmed that diamond crystals grew into columnar crystals. Particularly, the size of the diamond crystals was from 5 to 10 times as large as that of the diamond crystals deposited by applying a conventional stationary (continuous) microwave. Furthermore, it was customary in the conventional diamond films that they deposit initially as crystals of small diameter and gradually grow into crystals of larger diameter, and that they thereby have poor adhesion with the substrates. In the diamond crystals deposited by the pulsed wave process according to the present invention, however, the diamond crystals were large even at the interface with the depositing surface. Thus, a film can be formed on the substrate with the superior adhesion therebetween by the process according to the present invention. The electron beam diffraction image of the film revealed spots ascribed to single crystal diamonds, and it can be seen therefrom that a diamond structure clearly develop in the film by applying a power at an average output of 1.5 KW or higher.

The conventional diamond film deposition process using a stationary wave could only provide a 10 $\mu$ thick diamond film which easily undergo peeling by simply rubbing the surface with bare hands. However, the pulsed wave process according to the present invention provides diamond films of the same thickness as the conventional ones but which are completely resistant against peeling even when they are rubbed with a sand paper. That is, the pulsed wave process according to the present invention is capable of depositing thin films of diamond having excellent adhesion with the substrate.

EXAMPLE 3

Figure 6A:
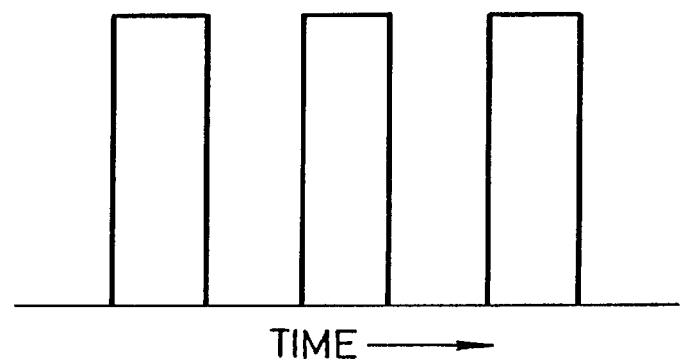
FIGS. 6(A) to 6(C) each show a pulsed waveform according to the present invention.
Figure 6B:
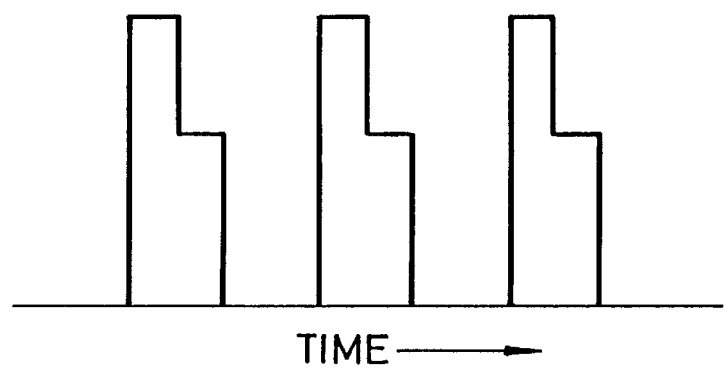
Figure 6C:
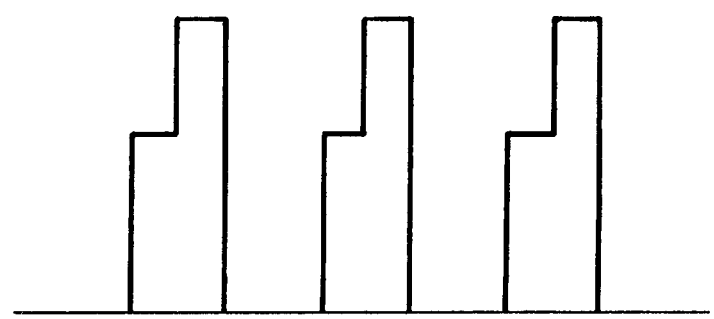

A DLC film was deposited by applying a microwave electric power having a pulsed waveform as shown in FIG. 6(A) synchronously with the electric power applied to generate a magnetic field having a pulsed waveform as shown in FIG. 6(A). A pulsed 2.45 GHz microwave having a peak value of 5 KW was externally applied at a pulse period of 8 ms. The magnetic field was similarly applied in pulses having a peak value of about 2 KGauss and at a pulse period of 8 ms, by operating the Helmholtz coils 5 and 5'.

The pulsed microwave and the magnetic field were completely synchronized to thereby provide a high density plasma in the plasma generating space 1.

In the embodiment, a thin film diamond was synthesized using a hydrogen diluted methanol as the starting material, applying a microwave power at an average output of 1.5 KW (peak value: 3.4 KW) and a pulse period of 8 ms. The cross section of the thin film was examined with a scanning electron microscope to observe diamond crystals. As a result, it was confirmed that diamond crystals grew into granular crystals. Particularly, the size of the diamond crystals was from 5 to 10 times as large as that of the diamond crystals deposited by applying a conventional stationary (continuous) microwave. Furthermore, it was customary in the conventional diamond films that they deposit initially as crystals of small diameter and gradually grow into crystals of larger diameter, and that they thereby suffer poor adhesion with the substrates. In the diamond crystals deposited by the pulsed wave process according to the present invention, however, the diamond crystals were large even at the interface with the depositing surface. Thus, a film can be formed on the substrate with the superior adhesion therebetween by the process according to the present invention. The electron beam diffraction image of the film revealed spots ascribed to single crystal diamonds, and it can be seen therefrom that a diamond structure clearly develop in the film by applying a power at an average output of 1.5 KW or higher.

The experimentally developed process according to the present invention enables deposition of a partially crystallized thin films under a wider range of film deposition conditions. Furthermore, the pulsed wave process according to the present invention enables deposition of uniform films on articles having irregularities on the depositing surface, at a reduced energy consumption as compared with the conventional process using a stationary continuous waves.

While the invention has been described in detail and with reference to specific embodiments thereof, it will be apparent to one skilled in the art that various changes and modifications can be made therein without departing from the spirit and scope thereof.

What is claimed is:

1. A method for forming a film comprising carbon, said method comprising the steps of:
    introducing a reactive gas into a reaction chamber;
    inputting pulsed high frequency electromagnetic waves to said reaction chamber in order to produce a plasma of said reactive gas;
    depositing the film comprising carbon on a surface of an object,
    wherein the high frequency electromagnetic waves are complex such that each pulse of said pulsed high frequency electromagnetic waves comprises at least first and second rectangular pulses having a different pulse height and occurring with a lapse of time therebetween, said second pulse occurring after said first pulse.

2. The method of claim 1 wherein said electromagnetic waves are supplied by microwave.

3. The method of claim 1 wherein said film comprises diamond-like carbon.

4. The method of claim 1 wherein said reactive gas comprises hydrocarbon.

5. The method of claim 1 wherein said electromagnetic waves are pulsed at a pulse duration of 1–30 msec.

6. The method according to claim 1 wherein a frequency of said high frequency electromagnetic waves is 2.45 GHz.

7. The method according to claim 1 wherein a frequency of said high frequency electromagnetic waves is 1.225 GHz.

8. The method according to claim 1 wherein said carbon has $sp^3$ hybridization bonding.

9. The method according to claim 1 wherein said carbon is i-carbon.

10. The method according to claim 1 wherein said carbon is diamond.

11. The method according to claim 1 wherein a pulse duration of the high frequency electromagnetic waves is 1 to 10 ms.

12. A method for forming a film comprising carbon, said method comprising the steps of:
    introducing a reactive gas into a reaction chamber;
    applying a pulsed high frequency electric power to said reactive gas in said reaction chamber,
    supplying a pulsed magnetic field in said reaction chamber by using an electromagnetic means;
    exciting said reactive gas by said pulsed high frequency electric power and said pulsed magnetic field; and
    forming the film comprising carbon on a surface of an object.

13. A method of claim 12 wherein said pulsed magnetic field is induced in synchronization with said pulsed high frequency electric power.

14. A method of claim 12 wherein said film comprises diamond-like carbon.

15. The method according to claim 12 wherein said high frequency power is microwaves.

16. The method according to claim 12 wherein a frequency of said high frequency power is 2.45 GHz.

17. The method according to claim 12 wherein a frequency of said high frequency power is 1.225 GHz.

18. The method according to claim 12 wherein said carbon has $sp^3$ hybridization bonding.

19. The method according to claim 12 wherein said carbon is i-carbon.

20. The method according to claim 12 wherein said carbon is diamond.

21. The method according to claim 12 wherein a pulse duration of the high frequency power is 1 to 10 ms.

22. A method for forming a film comprising carbon, said method comprising the steps of:
    introducing a reactive gas into a reaction chamber;
    supplying a pulsed electromagnetic energy having a high frequency to said reactive gas sufficient to convert said reactive gas into a plasma; and
    forming the film comprising carbon on a surface of an object,
    wherein a photo energy is applied to said reactive gas during said pulsed electromagnetic energy to maintain an activated state of said plasma.

23. The method of claim 22 wherein said film comprises diamond-like carbon.

24. The method according to claim 22 wherein said electromagnetic energy is microwaves.

25. The method according to claim 22 wherein a frequency of said electromagnetic energy is 2.45 GHz.

26. The method according to claim 22 wherein a frequency of said electromagnetic energy is 1.225 GHz.

27. The method according to claim 22 wherein said carbon has $sp^3$ hybridization bonding.

28. The method according to claim 22 wherein said carbon is i-carbon.

29. The method according to claim 22 wherein said carbon is diamond.

30. The method according to claim 22 wherein a pulse duration of the electromagnetic energy is 1 to 10 ms.

31. A method for forming a film comprising carbon, said method comprising the steps of:
introducing a reactive gas into a reaction chamber;
applying a pulsed electric power to said reactive gas to convert said gas into a plasma;
applying a continuous electromagnetic wave to said reactive gas so that said continuous electromagnetic wave is superposed on said pulsed electric power in order to stabilize said plasma; and
forming the film comprising carbon on a surface of an object in the reaction chamber using the plasma,
wherein said pulsed electric power is a pulsed microwave, said continuous wave is a high frequency wave, and an effective power value of said pulsed electric power is higher than an effective power value of said continuous electromagnetic wave.

32. The method of claim 31 wherein said film comprises diamond-like carbon.

33. The method according to claim 31 wherein said continuous electromagnetic wave is a microwave.

34. The method according to claim 31 wherein a frequency of said pulsed electric power is 2.45 GHz.

35. The method according to claim 31 wherein a frequency of said pulsed electric power is 1.225 GHz.

36. The method according to claim 31 wherein said carbon has $sp^3$ hybridization bonding.

37. The method according to claim 31 wherein said carbon is i-carbon.

38. The method according to claim 31 wherein said carbon is diamond.

39. The method according to claim 31 wherein a pulse duration of pulsed electric power is 1 to 10 ms.

40. A method for forming a film comprising carbon, said method comprising the steps of:
introducing a reactive gas into a reaction chamber;
applying a pulsed DC electric power to said reactive gas to convert said gas into a plasma;
applying a continuous electromagnetic wave to said reactive gas so that said continuous electromagnetic wave is superposed on said pulesd electric power to keep the plasma stable; and
forming the film comprising carbon on a surface of an object in said reaction chamber,
wherein an effective power value of said pulsed electric power is higher than an effective power value of said continuous electromagnetic wave.

41. The method of claim 40 wherein said film comprises diamond-like carbon.

42. The method according to claim 40 wherein said carbon has $sp^3$ hybridization bonding.

43. The method according to claim 40 wherein said carbon is i-carbon.

44. The method according to claim 40 wherein said carbon is diamond.

45. A method for forming a film comprising carbon, said method comprising the steps of:
introducing a reactive gas into a reaction chamber;
applying a pulsed DC electric power to said reactive gas to convert said gas into a plasma;
applying a continuous electromagnetic wave to said reactive gas so that said continuous electromagnetic wave is superposed on said pulsed electric power to keep the plasma stable; and
forming the film comprising carbon on a surface of an object in said reaction chamber,
wherein said pulsed electric power is pulsed DC, said continuous wave is a microwave, and an effective power value of said pulsed electric power is higher than an effective power value of said continuous electromagnetic wave.

46. The method of claim 45 wherein said film comprises diamond-like carbon.

47. The method according to claim 45 wherein said carbon has $sp^3$ hybridization bonding.

48. The method according to claim 45 wherein said carbon is i-carbon.

49. The method according to claim 45 wherein said carbon is diamond.

50. A method for forming a film comprising carbon, said method comprising the steps of:
introducing a reactive gas into a reaction chamber;
applying a pulsed electromagnetic wave to said reactive gas to convert said gas into a plasma;
applying a continuous electromagnetic wave to said reactive gas so that said continuous electromagnetic wave is superposed on said pulsed electromagnetic wave to keep the plasma stable; and
forming the film comprising carbon on a surface of an object in said reaction chamber,
wherein said pulsed electromagnetic wave has a different frequency from said continuous electromagnetic wave and an effective power value of said pulsed electromagnetic wave is higher than an effective power value of said continuous electromagnetic wave.

51. The method of claim 50 wherein said film comprises diamond-like carbon.

52. The method according to claim 50 wherein said carbon has $sp^3$ hybridization bonding.

53. The method according to claim 50 wherein said carbon is i-carbon.

54. The method according to claim 50 wherein said carbon is diamond.

55. A method for forming a film comprising carbon, said method comprising the steps of:
introducing a reactive gas into a reaction chamber;
applying a pulsed high frequency electric power to said reactive gas in said reaction chamber;
supplying a pulsed magnetic field in said reaction chamber;
exciting said reactive gas by said pulsed high frequency electric power and said pulsed magnetic field; and
forming the film comprising carbon on a surface of an object in said reaction chamber.

56. The method of claim 55 wherein said pulsed magnetic field is produced by using a coil.

57. The method of claim 55 wherein said film comprises diamond-like carbon.

58. The method according to claim 55 wherein said high frequency electric power is microwaves.

59. The method according to claim 55 wherein a frequency of said high frequency electric power is 2.45 GHz.

60. The method according to claim 55 wherein a frequency of said high frequency electric power is 1.225 GHz.

61. The method according to claim 55 wherein said carbon has $sp^3$ hybridization.

62. The method according to claim 55 wherein said carbon is i-carbon.

63. The method according to claim 55 wherein said carbon is diamond.

64. The method according to claim 55 wherein a pulse duration of the high frequency electric power is 1 to 10 ms.

65. A method for forming a film comprising carbon, said method comprising the steps of:

introducing a reactive gas into a reaction chamber;

applying a pulsed electromagnetic wave to said reactive gas to convert said gas into a plasma;

applying a continuous electromagnetic wave to said reactive gas so that said continuous electromagnetic wave is superposed on said pulsed electromagnetic wave to keep the plasma stable; and forming the film comprising carbon on a surface of an object in said reaction chamber, wherein an effective power value of said pulsed electromagnetic wave is higher than an effective power value of said continuous electromagnetic wave.

66. The method of claim 65 wherein said film comprises diamond-like carbon.

67. The method according to claim 65 wherein said pulsed electromagnetic wave is microwaves.

68. The method according to claim 65 wherein a frequency of said pulsed electromagnetic wave is 2.45 GHz.

69. The method according to claim 65 wherein a frequency of said pulsed electromagnetic wave is 1.225 GHz.

70. The method according to claim 65 wherein said carbon has $sp^3$ hybridization bonding.

71. The method according to claim 65 wherein said carbon is i-carbon.

72. The method according to claim 65 wherein said carbon is diamond.

73. The method according to claim 65 wherein a pulse duration of the pulsed electromagnetic wave is 1 to 10 ms.

74. A method of forming a film comprising carbon, said method comprising the steps of:

introducing a reactive gas into a reaction chamber;

supplying microwaves into said reaction chamber;

supplying a continuous electromagnetic wave into said reaction chamber so that said continuous electromagnetic wave is superposed on said microwaves in order to stabilize a plasma of the reaction gas in said reaction chamber;

inducing a magnetic field in said reaction chamber wherein a frequency of said microwaves and strength of the magnetic field satisfy a condition of an electron cyclotron resonance;

exciting said reactive gas in said reaction chamber;

depositing a film comprising carbon on a surface of an object, wherein said microwaves are pulsed.

75. The method according to claim 74 wherein the frequency of said microwaves is 2.45 GHz.

76. The method according to claim 74 wherein the frequency of said microwave is 1.225 GHz.

77. The method according to claim 74 wherein said carbon has $sp^3$ hybridization bonding.

78. The method according to claim 74 wherein said carbon is i-carbon.

79. The method according to claim 74 wherein said carbon is diamond.

80. The method according to claim 74 wherein said carbon is diamond-like carbon.

81. The method according to claim 74 wherein a pulse duration of the pulsed microwaves is 1 to 10 ms.

82. The method according to claim 74 wherein said continuous electromagnetic wave has a different frequency from said microwaves.

83. The method according to claim 74 wherein said continuous electromagnetic wave has a same frequency as said microwaves.

84. A method for forming a film, said method comprising the steps of:

introducing a reactive gas into a reaction chamber;

applying a pulsed frequency electric power to said reactive gas in said reaction chamber, supplying a pulsed magnetic field in said reaction chamber by using an electromagnetic means;

exciting said reactive gas by said pulsed high frequency electric power and said pulsed magnetic field; and forming the film on a surface of an object.

85. A method of claim 84 wherein said pulsed magnetic field is induced in synchronization with said pulsed high frequency electric power.

86. A method according to claim 84 wherein said film comprises a material selected from the group consisting of silicon carbide, aluminum nitride, aluminum oxide, zirconia, boron phosphide.

87. A method according to claim 84 wherein said film comprises a multilayer including a film of diamond and a film of a material selected from the group consisting of silicon carbide, aluminum nitride, aluminum oxide, zirconia, boron phosphide.

88. A method according to claim 84 wherein said film comprises a metal selected from the group consisting of tungsten, titanium and molybdenum, or a silicide thereof.

* * * * *